(12) United States Patent
Hattori

(10) Patent No.: US 11,703,252 B2
(45) Date of Patent: Jul. 18, 2023

(54) ANTISTATIC STRUCTURE AND AIR-CONDITIONER

(71) Applicant: DAIKIN INDUSTRIES, LTD., Osaka (JP)

(72) Inventor: Takayuki Hattori, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 17/845,320

(22) Filed: Jun. 21, 2022

(65) Prior Publication Data

US 2022/0316753 A1   Oct. 6, 2022

Related U.S. Application Data

(63) Continuation of application No. PCT/JP2020/031702, filed on Aug. 21, 2020.

(30) Foreign Application Priority Data

Dec. 23, 2019   (JP) ................................. 2019-231497

(51) Int. Cl.
*F24F 13/20*   (2006.01)

(52) U.S. Cl.
CPC .................................. *F24F 13/20* (2013.01)

(58) Field of Classification Search
CPC ........ F24F 13/00; F24F 13/02; F24F 13/0263; F24F 13/0281; F24F 13/08; F24F 13/20; H05K 7/20; F25D 23/00; F25D 17/06
USPC ......... 361/211–212; 62/303, 317, 426, 259.1
See application file for complete search history.

(56) References Cited

U.S. PATENT DOCUMENTS

| | | | | |
|---|---|---|---|---|
| 5,934,368 A | * | 8/1999 | Tanaka | H05K 7/207 236/44 R |
| 2009/0183521 A1 | * | 7/2009 | Shibuya | F24F 8/108 62/426 |
| 2010/0263829 A1 | * | 10/2010 | Kimura | F24F 1/00075 165/104.34 |
| 2015/0049431 A1 | * | 2/2015 | Kondo | G06F 1/20 361/679.47 |
| 2015/0366110 A1 | | 12/2015 | Park et al. | |
| 2018/0051905 A1 | * | 2/2018 | Morioka | F24F 13/22 |

(Continued)

FOREIGN PATENT DOCUMENTS

| | | |
|---|---|---|
| CN | 209263284 U | 8/2019 |
| JP | 60-17524 U | 2/1985 |
| JP | 60-230316 A | 11/1985 |

(Continued)

OTHER PUBLICATIONS

International Preliminary Report on Patentability and English translation of the Written Opinion of the International Searching Authority for International Application No. PCT/JP2020/031702, dated Jul. 7, 2022.

(Continued)

*Primary Examiner* — Tuan T Dinh
(74) *Attorney, Agent, or Firm* — Birch, Stewart, Kolasch & Birch, LLP

(57) ABSTRACT

An antistatic structure includes a casing, an element disposed in the casing, and a first conductive member disposed on an inner face of the casing and configured to send static electricity to a ground. The first conductive member is at least partially disposed around a region opposite the element in the casing.

7 Claims, 9 Drawing Sheets

(56) References Cited

U.S. PATENT DOCUMENTS

2018/0319375 A1\* 11/2018 Weigle .................. B60S 1/481

FOREIGN PATENT DOCUMENTS

| JP | 60-193697 U | 12/1985 |
| JP | 2-95166 U | 7/1990 |
| JP | 3-93341 U | 9/1991 |
| JP | 4-118598 U | 10/1992 |
| JP | 2005-338628 A | 12/2005 |
| JP | 2008-145086 A | 6/2008 |
| JP | 2014-165046 A | 9/2014 |

OTHER PUBLICATIONS

Decision to Grant a Patent issued in JP Application No. 2019-231497, dated Jan. 5, 2022.
International Search Report (PCT/ISA/210) issued in PCT/JP2020/031702, dated Oct. 27, 2020.
Notice of Reasons for Refusal issued in JP Application No. 2019-231497, dated Jun. 22, 2021.
Notice of Reasons for Refusal issued in JP Application No. 2019-231497, dated Oct. 20, 2020.
Written Opinion of the International Searching Authority (PCT/ISA/237) issued in PCT/JP2020/031702, dated Oct. 27, 2020.
Extended European Search Report dated Dec. 20, 2022 in corresponding European Application No. 20907078.8.

\* cited by examiner

ANTISTATIC STRUCTURE AND AIR-CONDITIONER

CROSS REFERENCE TO RELATED APPLICATIONS

This application is a Continuation of PCT International Application No. PCT/JP2020/031702, filed on Aug. 21, 2020, which claims priority under 35 U.S.C. § 119(a) to Patent Application No. 2019-231497 filed in Japan on Dec. 23, 2019, all of which are hereby expressly incorporated by reference into the present application.

TECHNICAL FIELD

The present disclosure relates to antistatic structures and air conditioners.

BACKGROUND ART

An antistatic structure for an electronic device is known from, for example, JP H04-118598 U (Patent Literature 1), that includes a conductive thin layer disposed on a front surface of a main body portion of the electronic device from which surface an electronic component is exposed, an extension portion that extends from the conductive thin layer along a side surface of the main body portion, and a grounding portion disposed near the extension portion with a minute spacing defined between the grounding portion and the extension portion. The antistatic structure sends static electricity from the conductive thin layer to a ground via the grounding portion, which static electricity might otherwise be sent to the electronic component.

The antistatic structure described above sends the static electricity to the ground via the grounding portion that is at a ground potential of the electronic component mounted on a substrate of the main body portion. Therefore, there is a high possibility that the antistatic structure causes damage to the electronic component.

In addition, the antistatic structure has a poor design since the conductive thin layer is provided on the front surface of the main body portion from which the electronic component is exposed.

SUMMARY

The present disclosure proposes an antistatic structure capable of dissipating static electricity on a casing to a ground, and an air conditioner having the antistatic structure.

An aspect of the present disclosure provides an antistatic structure including:

a casing;

an element disposed in the casing; and a first conductive member disposed on an inner face of the casing and con figured to send static electricity to a ground. The first conductive member is at least partially disposed around a region opposite the element in the casing.

The present disclosure also provides an air conditioner including such an antistatic structure.

DESCRIPTION OF EMBODIMENTS

Figure 1:
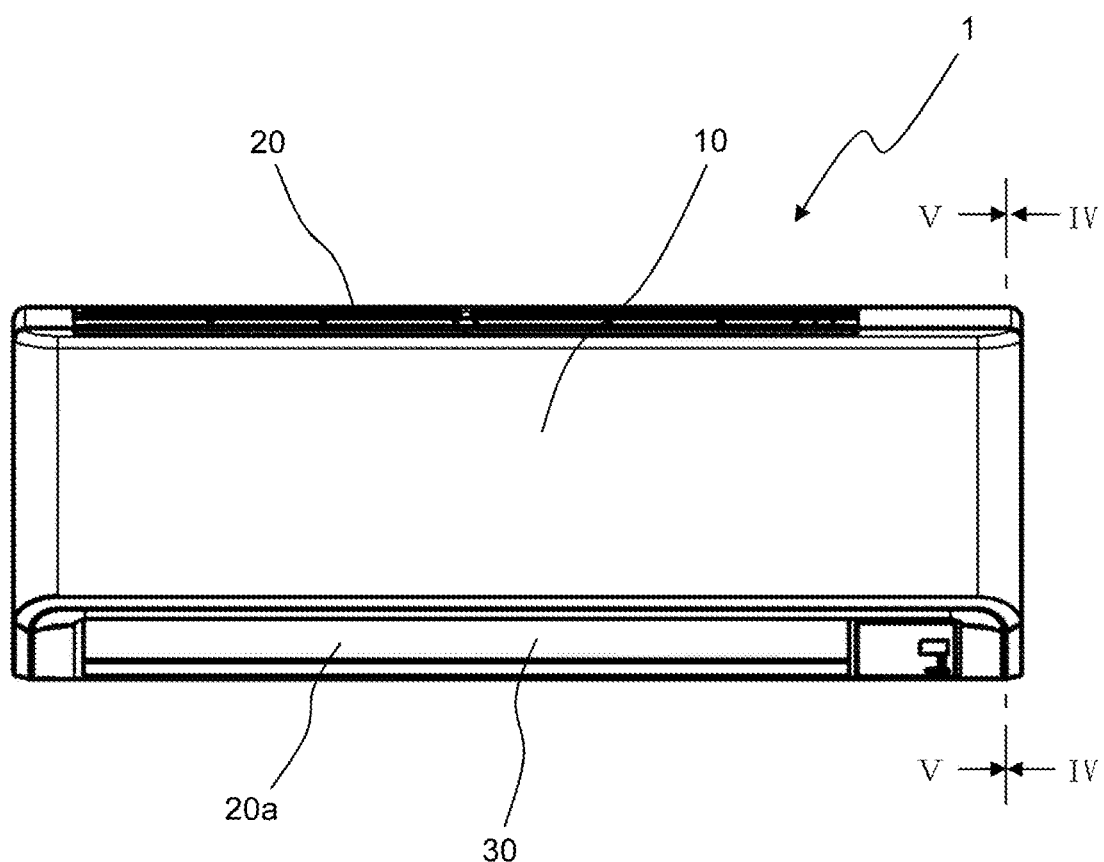
FIG. 1 is a front view of an indoor unit of an air conditioner having an antistatic structure according to a first embodiment of the present disclosure.

Embodiments will be described below. In the drawings, identical reference signs indicate identical or corresponding portions. The dimensions, such as a length, a width, a thickness, and a depth, illustrated in the drawings are appropriately changed from actual scales for making the drawings clear and simple; therefore, the actual relative dimensions are not illustrated in the drawings.

First Embodiment

FIG. 1 is a front view of an indoor unit 1 of an air conditioner having an antistatic structure according to a first embodiment of the present disclosure. The air conditioner having the antistatic structure according to the first embodiment includes the indoor unit 1 to be fastened to a wall of a room.

As illustrated in FIG. I, the indoor unit 1 includes a front panel 10, a front grille 20 to which the front pane) 10 is mounted, and a bottom frame (not illustrated) to which the front grille 20 is mounted. Mounted to the bottom frame arc an indoor heat exchanger, a drain pan. a cross-flow fan, an electric component unit 40 (see FIG. 2), and the like.

The front grille 20 is an example of a casing. 1110 front grille 20 has in its front lower aide a blow-out port 20a to which a horizontal flap 30 is mounted in a swingable manner.

Figure 2:
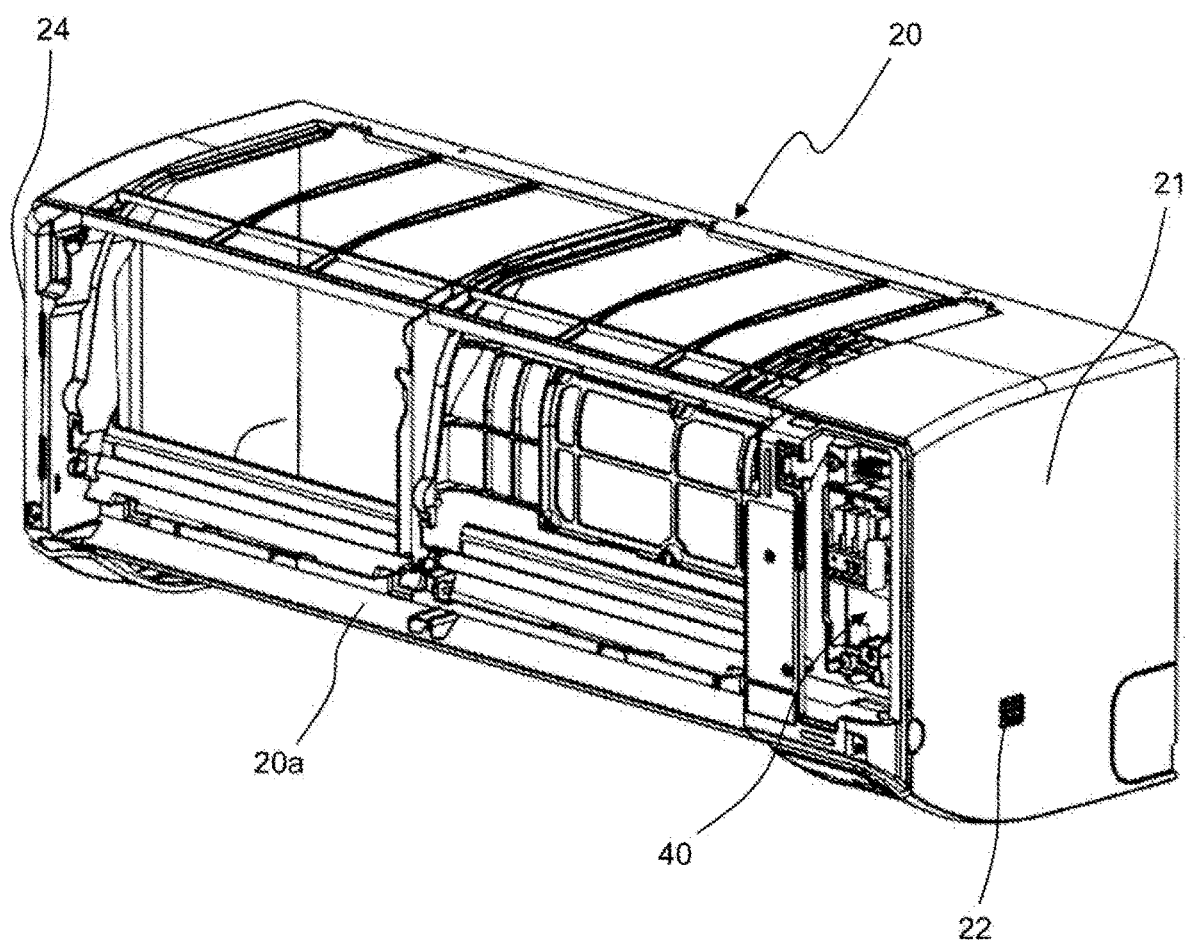
FIG. 2 is a perspective view of a front grille of the indoor twit according to the first embodiment.

FIG. 2 is a perspective view of the front grille 20 of the indoor unit 1. As illustrated in FIG. 2. the front grille 20 includes a right-side portion 21 and a left-side portion 24. The front grille 20 accommodates therein the electric component unit 40 in the vicinity of the right-side portion 21.

Figure 3:
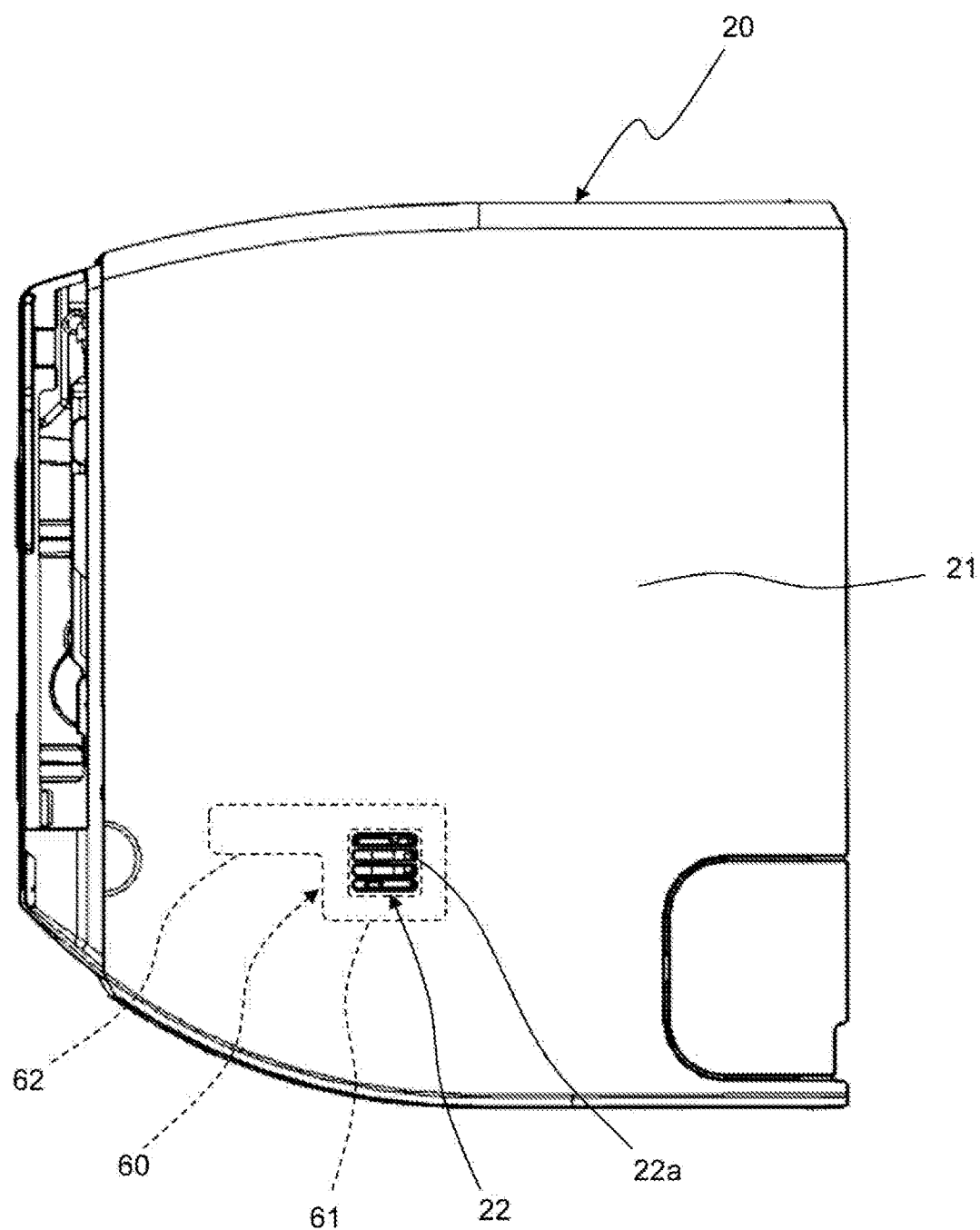
FIG. 3 is a right side view of the front grille according to the first embodiment.

FIG. 3 is a right side view of the front grille 20. T he right-side portion 21 has in its lower side an opening 22 made up of a plurality of slits 22a. A conductive tape 60 illustrated in FIG. 3 is an example of a first conductive member (see also FIG. 5).

Figure 4:
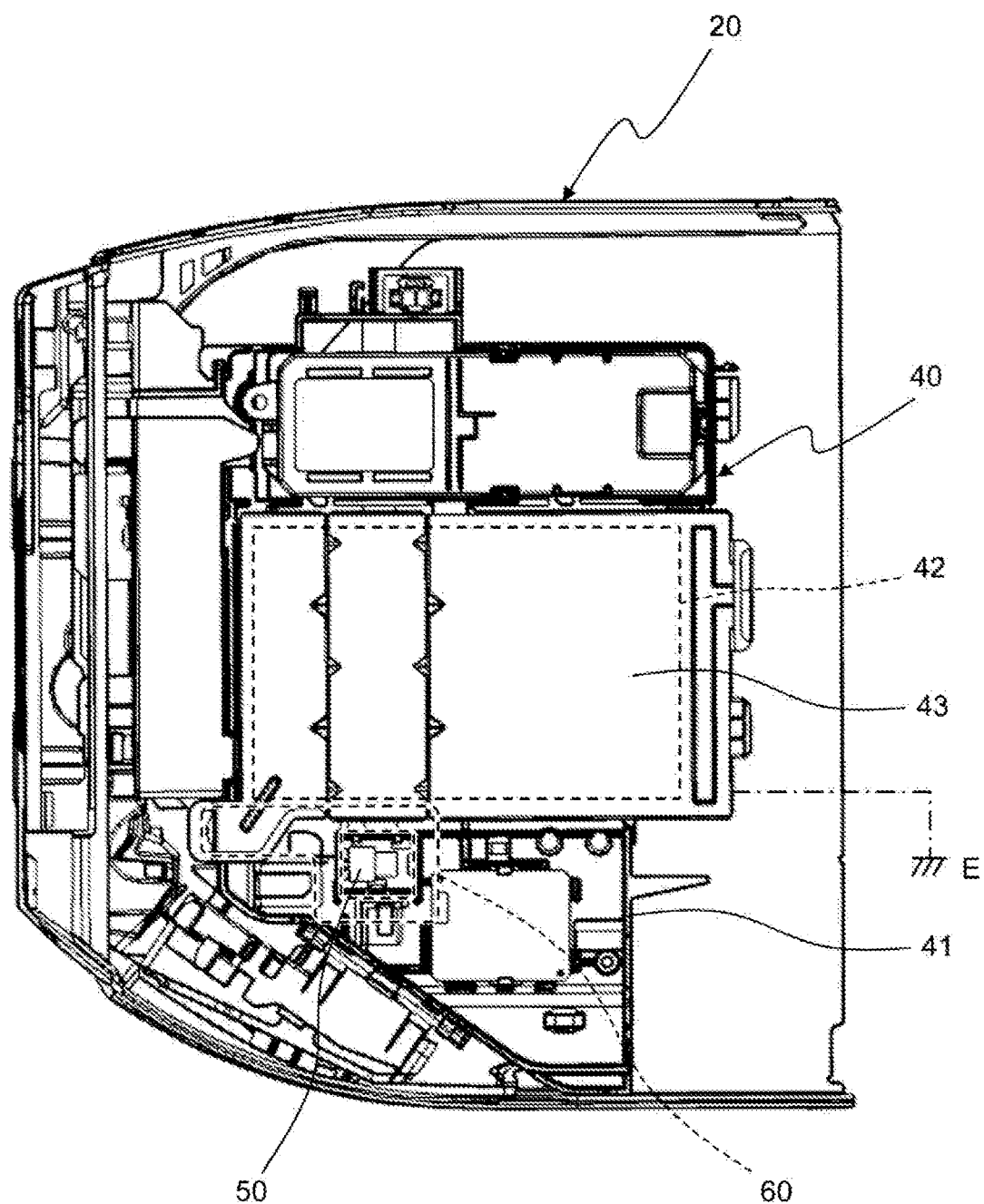
FIG. 4 is a longitudinal sectional view taken along line IV-IV in FIG. 1.

FIG. 4 is a longitudinal sectional view taken along line IV-IV in FIG. 1. The electric component unit 40 includes a base member 41 made of a resin, a control board 42 mounted to the center right of the base member 41, a metal cover 43 mounted to the base member 41 so as to cover the control board 42, and a temperature and humidity sensor 50 disposed on the right side of the base member 41 and below the control board 42. The metal cover 43 is an example of a second conductive member. The temperature and humidity sensor 50 is an example of an element and is configured to defect a temperature and a humidity of indoor air.

In the right-side portion 21 of the front grille 20, the opening 22 is located in a region opposite the temperature and humidity sensor 50. The temperature and humidity sensor 50 (the element) detects a temperature and a humidity of air flowing into tire front grille 20 through the opening 22.

Figure 5:
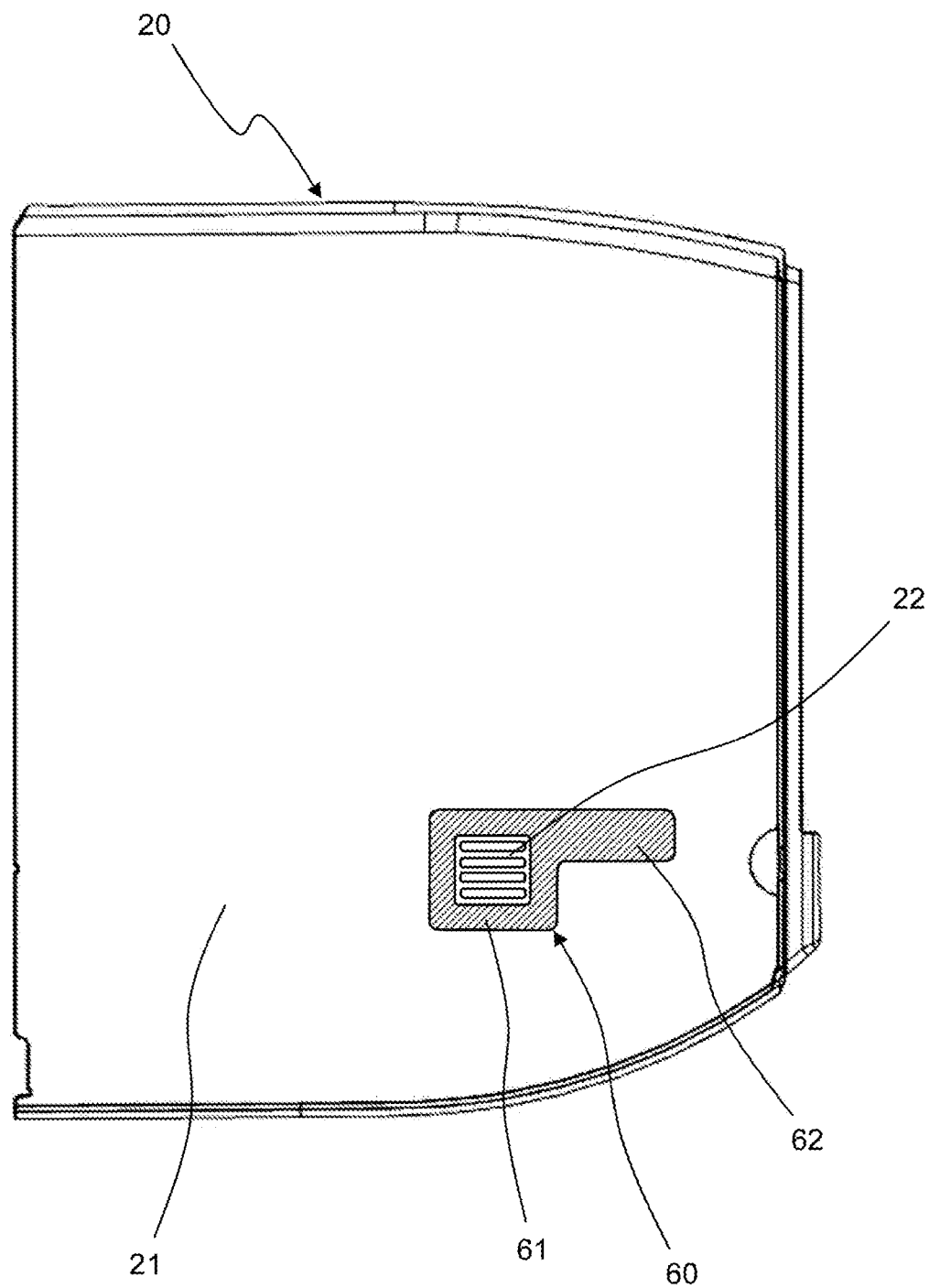
FIG. 5 is a longitudinal sectional view taken along line V-V in FIG. 1.

FIG. 5 is a longitudinal sectional view taken along line V-V in FIG. 1. As illustrated in FIG. 5, the right-side portion 21 has on its inner side a base portion 61 having a quadrilateral frame shape and entirely surrounding the opening 22, and an extension portion 62 extending forward along an inner face of the right-side portion 21 in a direction away from the opening 22. The base portion 61 and the extension portion 62 make up the conductive tape 60.

In the first embodiment, the conductive tape 60 is an example of the first conductive member. However, the first conductive member is not limited to a conductive tape. For example, the first conductive member may be a metal film such as a plated film or may be a conductive coating.

The antistatic structure is constituted of the front grille 20, the temperature and humidity sensor 50, the conductive tape 60, and the metal cover 43.

Figure 6:
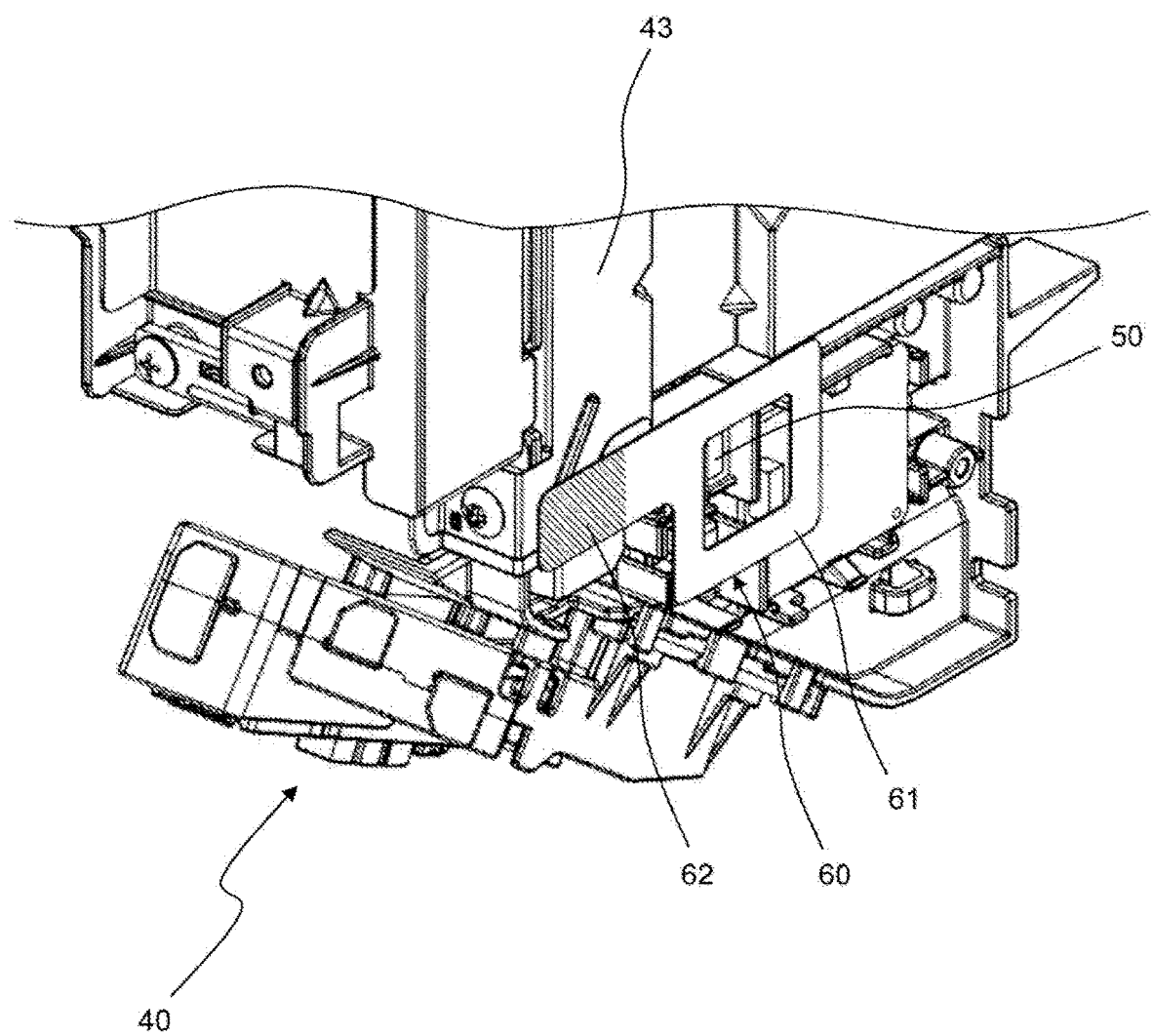
FIG. 6 is a perspective view of a lower side of an electric component unit and a conductive tape in the indoor unit according to the first embodiment.
Figure 7:
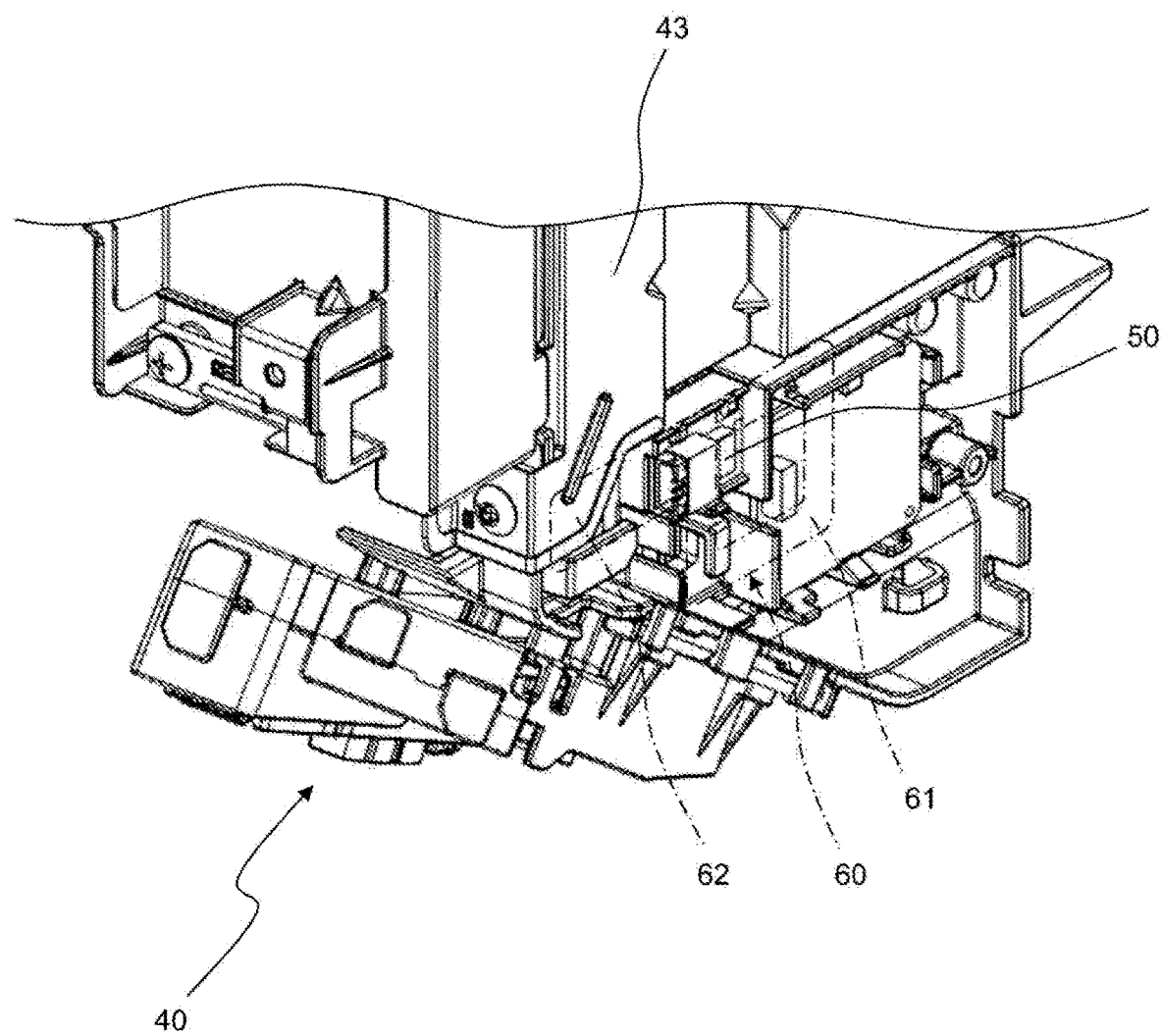
FIG. 7 a perspective view of the lower side of the electric component unit according to the first embodiment.

FIG. 6 is a perspective view of a lower side of the electric component unit 40 and the conductive tape 60. FIG. 7 is a perspective view of the lower side of the electric component unit 40. FIGS. 6 and 7 each have no illustration of the front grille 20.

As illustrated in FIGS. 6 and 7, a distal end (see a hatched area in FIG. 6) of the extension portion 62 of the conductive tape 60 is nearest to the metal cover 43.

Figure 8:
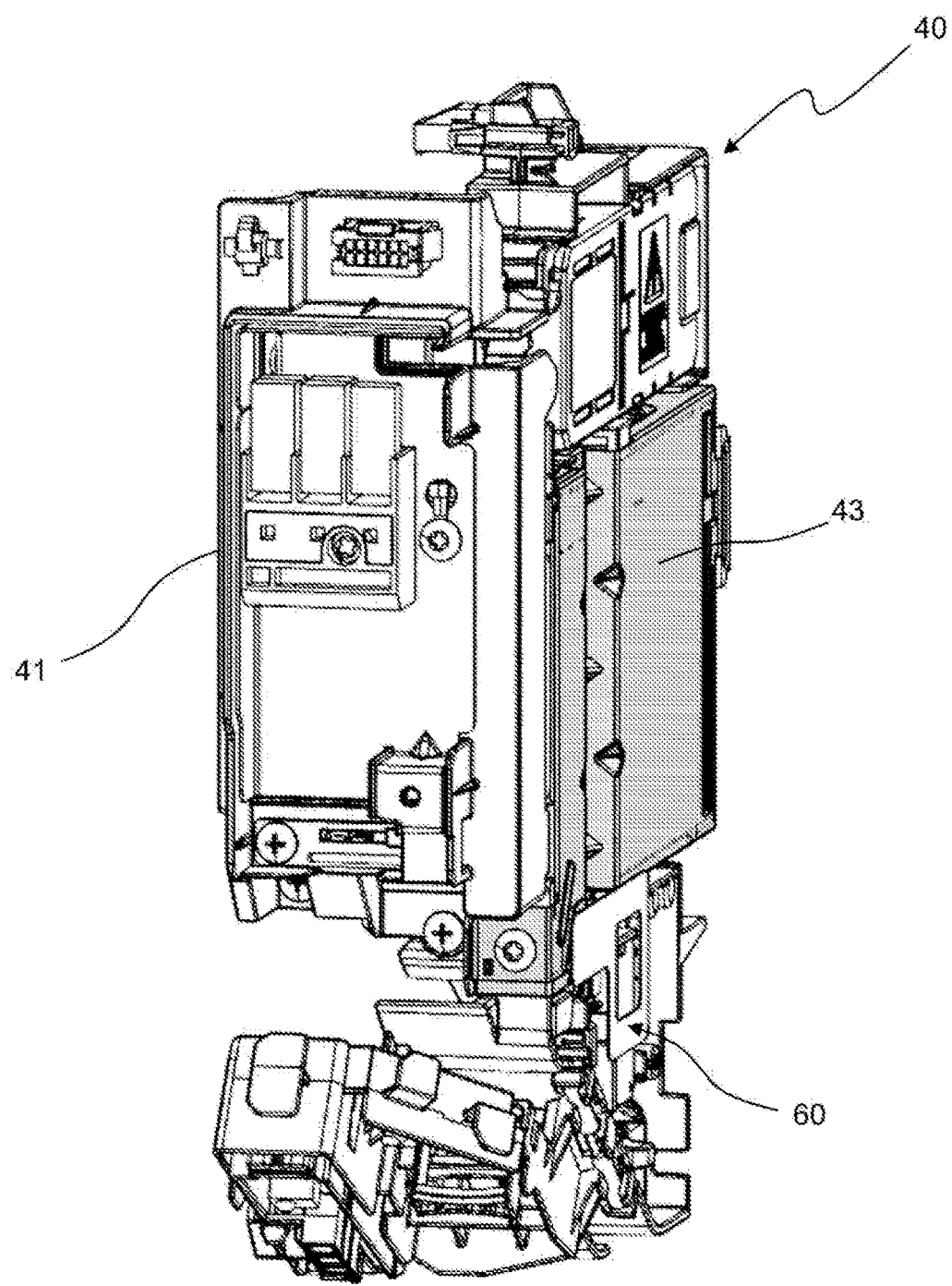
FIG. 8 is a perspective view of the electric component mit and the conductive tape according to the first embodiment.
Figure 9:
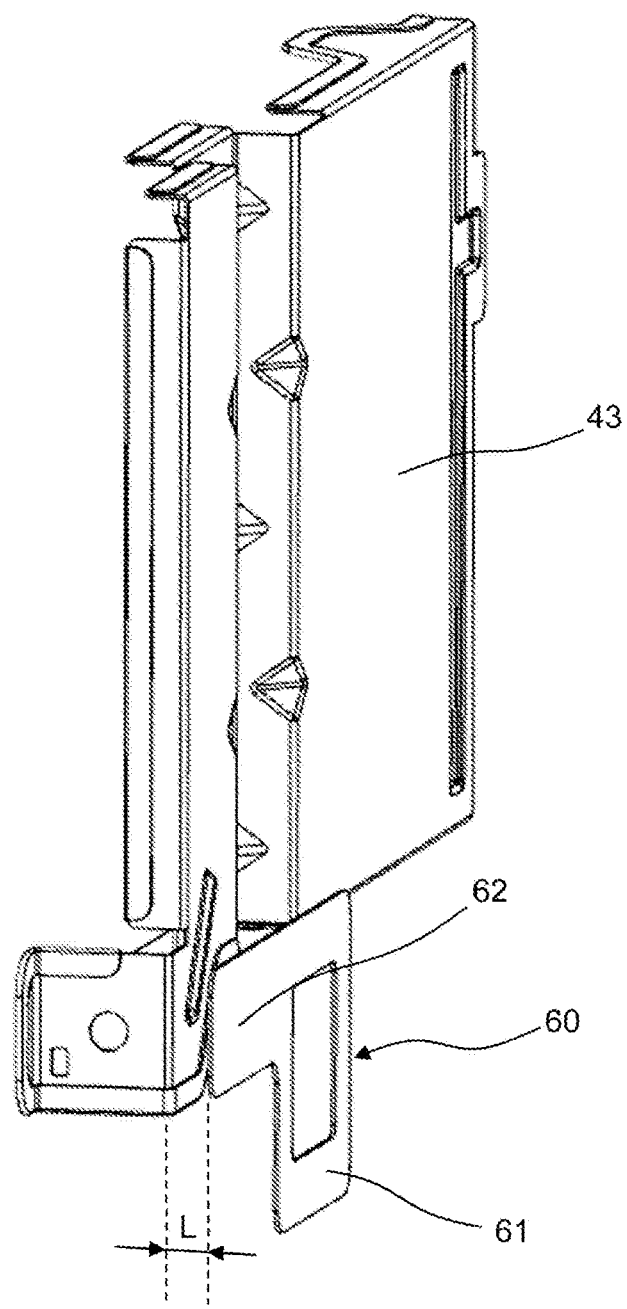
FIG. 9 is a perspective view of a metal cover of the electric component unit and the conductive tape according to the first embodiment.

FIG. 8 illustrates a positional relationship between the electric component unit 40 find the conductive tape 60. FIG. 9 is a perspective view of the metal cover 43 and the conductive tape 60. In FIG. 8, the metal cover 43 is tilled with gray for clarification of the illustration.

A spatial distance L between the metal cover 43 and the distal end of the extension portion 62 of the conductive tape 60. as illustrated in FIGS. 8 and 9, is 4.6 mm. The metal cover 43 is electrically connected to a ground F.

In relation to this, a spatial distance between the temperature and humidity sensor 50 (the element,) and the opening 22 in the right-side portion 21 of the front grille 20 is 6 mm.

An electronic apparatus such as an air conditioner needs to satisfy conditions of a 15-kV electrostatic test compliant with IEC 6100-4-2. or JIS 6100-4-2. If the conductive tape 60 is not used in the indoor unit 1, the temperature and humidity sensor 50 (the element) should be spaced apart from the opening 22 by at least 15 mm condition teat an atmospheric insulation distance (i.e., a spatial distance) is 1 mm at 1 kV. However, when the temperature and humidity sensor 50 (the element) is too fin from the opening 22, the temperature and humidity sensor 50 fails to accurately detect a temperature and a humidity.

In the indoor unit 1, the antistatic structure including the conductive tape 60 allows the temperature and humidity sensor 50 (the element) to accurately detect a temperature and a humidity on condition that the spatial distance between the opening 22 and the temperature and humidity sensor 50 (the element) is 6 mm. The indoor unit 1 also takes a measure static electricity for the temperature and humidity sensor 50 (the element). The temperature and humidity sensor 50 (tile element) is brought closer to the opening 22 so that a distance therebetween is shot er than 15 mm, which is an insulation distance (a spatial distance) at a voltage of 15 kV. The temperature and humidity sensor 50 (the element) is thus disposed at a position where the temperature and humidity sensor 50 (the element) has favorable temperature and humidity followability.

In the antistatic structure according to the first embodiment, the conductive tape 60 (the first conductive member) disposed on the inner face of the front grille 20 (the casing) is partially disposed around the region opposite the temperature and humidity sensor 50 (the element) in the front grille 20, so that static electricity applied to the front grille 20 is dissipated to the ground E via the conductive tape 60 and the metal cover 43 (the second conductive member). The static electricity in the front grille 20 is thus dissipated to the ground E without flowing into the temperature and humidity sensor 50.

The indoor unit I having the antistatic structure obtained a good result of the electrostatic test compliant with IEC 6100-4-2 or JIS 6100-4-2.

In the antistatic structure, the conductive tape 60 as a static electricity countermeasure is disposed on the inner face of the front grille 20 and is not viewed from the outside. Therefore, the conductive tape 60 does not impair the external design of the indoor unit 1.

In addition, since the conductive tape 60 is disposed around the opening 22 in the region opposite the temperature and humidity sensor 50 in the front grille 20, static electricity is dissipated to the ground E via the conductive tape 60 and the metal cover 43 even when static electricity is prone to be applied to the front grille 20 due to secular accumulation of dust, in the opening 22. The antistatic structure thus maintains the measure against static electricity for the temperature and humidity sensor 50 located near the opening 22, for a longer period of time.

In addition, since the base portion 61 of the conductive tape 60 surrounds the opening 22 in the front grille 20, the antistatic structure thus produces an improved advantageous effect of the measure against static electricity for the temperature and humidity sensor 50.

In the first embodiment, the base portion 61 of the conductive tape 60 entirely surrounds the opening 22 in the front grille 20. The antistatic structure may alternatively include a first electric member such as a conductive tape partially surrounding the opening 22 in the front grille 20.

In addition, the conductive tape 60 is electrically connected to the metal cover 43 in a contactless manner. This eliminates a wire or the like to electrically connect the conductive tape 60 to the metal cover 43 electrically connected to the ground E, and eventually facilitates removal or detachment of the front grille 20. The antistatic structure thus improves in assemblability and maintainability. The conductive tape 60 is electrically connected to the metal cover 43 via the atmosphere in a contactless manner.

In the conductive tape 60, the extension portion 62 is the nearest to the metal cover 43 connected to the metal cover 43, so that static electricity applied to the front grille 20 is dissipated to the ground E via the extension portion 62 of the conductive tape 60 and the metal cover 43. Therefore, the antistatic structure facilitates setting of a route for static electricity flowing from the conductive tape 60 to the ground E, in accordance with, for example, arrangement of the respective components in the front grille 20.

The shortest distance between the conductive tape 60 and the temperature and humidity sensor 50 is longer than the shortest distance between the conductive tape 60 and the metal cover 43 connected to the ground E. The antistatic structure therefore reliably dissipates static electricity to the ground E by discharging the static electricity at the position where the conductive tape 60 is nearest to the metal cover 43, without sending the static electricity to the temperature and humidity sensor 50.

The air conditioner according to the first embodiment has the antistatic structure described above. The air conditioner according to the first embodiment thus takes a measure against static electricity for the temperature and humidity sensor 50 in the front grille 20, by dissipating static electricity in the front grille 20 to the ground E with a simple configuration.

In the first embodiment, the antistatic structure is constituted of the front grille 20, tire temperature and humidity sensor 50, the conductive tape 60 (the first conductive member), and the metal cover 43 (the second conductive member). However, the antistatic structure does not necessarily include the second conductive member. In such an antistatic structure, for example, the first conductive member may define a route for dissipating static electricity to the ground E.

Second Embodiment

Next, a description will be given of an air conditioner having an antistatic structure according to a second embodiment of the present disclosure.

In the antistatic structure according to the first embodiment, the conductive tape 60 (the first conductive member) is electrically connected to the ground E in a contactless manner via the metal cover 43. In the air conditioner according to the second embodiment, a first conductive member disposed on an inner face of a casing and a second conductive member disposed in the casing and connected to a ground B arc electrically connected to each other in a contact manner. Static electricity applied to the casing is thus dissipated to the ground E via die first conductive member and the second conductive member.

The first conductive member and the second conductive member may be electrically connected to each other with a connection member such as a wire.

The antistatic structure according to the second embodiment is similar in advantageous effects to the antistatic structure according to the first embodiment.

Third Embodiment

Next, a description will be given of an air cleaner having, an antistatic structure according to a third embodiment of the present disclosure.

The air cleaner according to the third embodiment includes a casing and a humidity sensor disposed in the casing. The casing has an opening located in a region opposite the humidity sensor. A first conductive member is disposed on an inner face of the easing to dissipate static electricity to a ground E.

The antistatic structure according to the third embodiment is similar in advantageous effects to the antistatic structure according to the first embodiment.

The first to third embodiments concern an air conditioner having an antistatic structure and an air cleaner having an antistatic structure. An antistatic structure according to this invention is also applicable to another apparatus such as a remote controller in which a temperature sensor or the like is incorporated.

In the first to third embodiments, the casing has the opening located in the region opposite the temperature and humidity sensor 50 or the humidity sensor as the element. The casing does not necessarily have the opening as long as the first conductive member disposed on tire inner face of the casing is at least partially disposed around the region opposite the element in the casing.

In the first to third embodiments, the antistatic structure includes the temperature and humidity sensor 50 or the humidity sensor as the element disposed in the casing. However, the element is not limited thereto. This invention is applicable 10 an antistatic structure including an odor sensor or an element different from a sensor. Examples of the element different from the sensor may include, but not limited to, constituent components of a WiFi (registered trademark) module.

The foregoing description concerns specific embodiments of the present disclosure; however, the present disclosure is not limited to the first to third embodiments, and various modifications and variations may be made within the scope of the present disclosure.

REFERENCE SIGNS LIST

1 indoor unit
10 Front panel
20 Front grille (casing)
20*a* Blow-out port
21 Right-side portion
22 Opening
22*a* Slit
24 Left-side portion
30 Horizontal flap
40 Electric component unit
41 Base member
42 Control board
43 Metal cover (second conductive member)
50 Temperature and humidity sensor (element)
60 Conductive tape (first conductive member)
61 Base portion
62 Extension portion
E Ground

What is claimed is:

1. An air conditioner having an antistatic structure, the antistatic structure comprising:
   a casing;
   a sensor disposed in the casing and configured to detect a temperature, a humidity, or an odor of an atmosphere outside the casing;
   a first conductive member disposed on an inner face of the casing and configured to send static electricity to a ground, and
   a second conductive member disposed in the casing and electrically connected to the ground, wherein the first conductive member is electrically connected to the second conductive member in a contactless manner,
   the casing having an opening located in a region opposite the sensor,
   the first conductive member being at least partially disposed around the region opposite the sensor in the casing,
   the sensor being located more inside of the casing than the first conductive member, relative to the opening of the casing, wherein a spatial distance between the sensor and the opening is less than 15 mm.

2. The air conditioner having an antistatic structure according to claim 1, wherein
   the first conductive member is disposed around the opening in the casing.

3. The air conditioner having an antistatic structure according to claim 1, wherein a shortest distance between the first conductive member and the sensor is longer than a shortest distance between the first conductive member and the second conductive member.

4. The air conditioner having an antistatic structure according to claim 2, wherein
the first conductive member entirely surrounds the opening in the casing.

5. An air conditioner having an antistatic structure, the antistatic structure comprising:
a casing;
a sensor disposed in the casing and configured to detect a temperature, a humidity, or an odor of an atmosphere outside the casing; and
a first conductive member disposed on an inner face of the casing and configured to send static electricity to a ground,
the casing having an opening located in a region opposite the sensor,
the first conductive member being at least partially disposed around the region opposite the sensor in the casing,
the sensor being located more inside of the casing than the first conductive member, relative to the opening of the casing, and
a second conductive member disposed in the casing and electrically connected to the ground, wherein
the first conductive member is electrically connected to the second conductive member in a contactless manner,
the first conductive member includes an extension portion extending along the inner face of the casing, and
the extension portion of the first conductive member is nearest to the second conductive member.

6. An air conditioner having an antistatic structure, the antistatic structure comprising:
a casing having a side portion;
at least one of a temperature sensor, a humidity sensor, or an odor sensor disposed in the casing;
a first conductive member disposed on an inner face of the side portion of the casing and configured to send static electricity to a ground, and
a second conductive member disposed in the casing and electrically connected to the ground, wherein the first conductive member is electrically connected to the second conductive member in a contactless manner,
the side portion of the casing having an opening facing the sensor, and a peripheral region outside of the opening and surrounding the opening, the opening and the peripheral region being in one plane,
the first conductive member being at least partially disposed in the peripheral region of the side portion,
the sensor being located more inside of the casing than the first conductive member, relative to the opening, wherein a spatial distance between the sensor and the opening is less than 15 mm.

7. The air conditioner according to claim 6, wherein the first conductive member is invisible from outside of the casing.

* * * * *